MULTILAYER PRINTED CIRCUITS

Filed Nov. 12, 1964 2 Sheets-Sheet 1

INVENTOR
JAMES R. SHUTT

BY Hurvitz & Rose
ATTORNEYS

INVENTOR
JAMES R. SHUTT

BY Hurvitz & Rose

ATTORNEYS

United States Patent Office
3,340,607
Patented Sept. 12, 1967

3,340,607

MULTILAYER PRINTED CIRCUITS

James R. Shutt, Alexandria, Va., assignor to Melpar, Inc., Falls Church, Va., a corporation of Delaware Filed Nov. 12, 1964, Ser. No. 410,474
2 Claims. (Cl. 29—625)

ABSTRACT OF THE DISCLOSURE

A process for providing multilayer printed circuit boards whose exterior surfaces, including the areas immediately adjacent plated through-holes, are free of lands, pads, or other plated configurations, by seeding the entire exposed surface of the board including the as yet unplated through-holes with a thin conductive film, completely masking the exterior parallel board surfaces, and electroplating the walls of the through-holes only, via the conductive film on the board surfaces.

Figure 2:
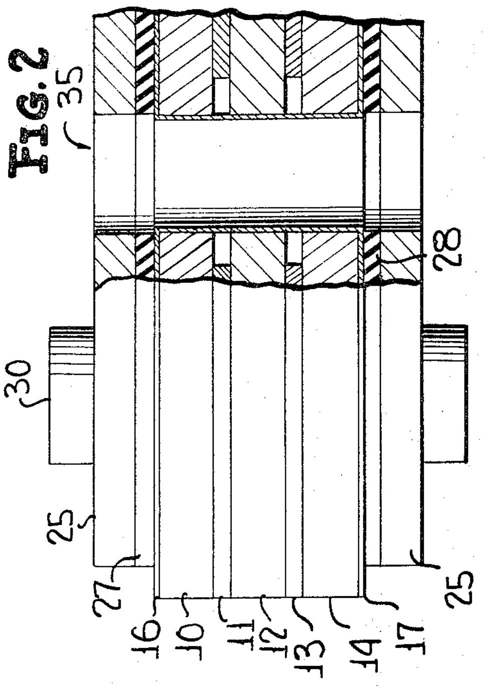

The present invention relates generally to multilayer printed circuits and more particularly to methods for providing conductive feed-through holes for interconnecting the several printed circuit strata in a composite circuit board while eliminating conductive land areas on the exterior surfaces of the composite board.

The development of printed circuitry stemmed, to a large extent, from the need for miniaturized electrical networks which would permit high packing density of circuit components into a reliable structure, and which could be adapted to manufacture or fabrication by automated mass production. More recently, the need for greater circuit complexity has resulted in the development of composite printed circuit boards wherein conductive circuit patterns are provided in a plurality of layers, strata, or planes on insulating boards or sheets which are bonded together and punched or drilled for subsequent provision of conductive through-holes to interconnect the several circuit layers into a single complex network. Certain of the circuit components may be integrated into the interior circuit structure of the composite board in a known manner. The great majority of circuit components or elements, however, must be mounted on the exterior surfaces of the board for interconnection in a given finalized circuit design.

Prior art methods of fabricating these composite boards have resulted in the existence of conductive areas known as lands or pads on the exterior surface areas of the board, generally surrounding the plated through-holes. To permit an extremely dense placement of miniaturized electronic components on these exterior surface areas it has been necessary to employ a subsequent step wherein the conductive plating is removed from the exterior surfaces by abrasion techniques, such as sanding or buffing. Etching techniques have proved insufficient and costly because of the length of time required to etch the relatively thick plating and the consequent close supervision and specialized techniques necessary to insure that only the plated land or pad areas about the through-holes are removed, and that the plated through-holes themselves are not etched or eroded. The desired result is that the through-holes be left flush and padless at the exterior surfaces of the board to permit greater utilization of the surface area for the high density packing of miniaturized electronic elements.

The prior art methods of removing the exterior lands are disadvantageous because the smooth surfaces of the exterior insulating sheets are disrupted and the board dielectric substrate abraded or otherwise deleteriously affected. As a consequence of this surface marring or disruption, the composite board has higher moisture absorption and lower dielectric failure values than are generally permissible. Therefore, special surface coatings are required to compensate for the degradated properties of the composite board.

It is, accordingly, a principal object of the present invention to overcome one or more of the disadvantages present in the prior art methods of fabrication of multilayer printed circuit boards.

In accordance with the present invention a mask is applied to the exterior surface areas of the multilayer board prior to the plating process to prevent plating thereof, and thus to insure that the final plated through-holes are flush with the exterior surfaces when the mask is removed, leaving padless, electrically conductive feed-throughs. By virtue of this method, there is no degrading removal of dielectric substrate, nor any need for special coatings to compensate for the abrasion of the board surface. The term "mask" as used in this specification refers to templates, plating resist emulsions or other elements, compositions or techniques for inhibiting or resisting the deposition of plating material on a surface.

It is, therefore, a further object of the present invention to provide a method for manufacturing multilayer printed circuit boards having landless exterior surface areas to permit greater utilization of the board surface areas for extremely dense placement of miniaturized electronic components.

Figure 1:
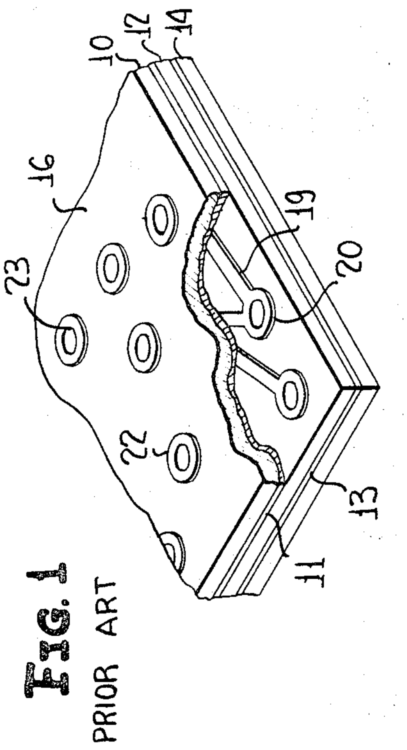
FIG. 1 PRIOR ART
Figure 5:
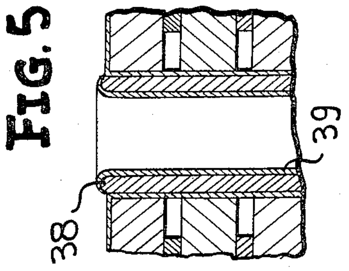
Figure 4:
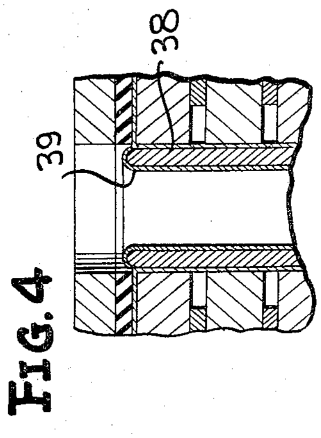
Figure 3:
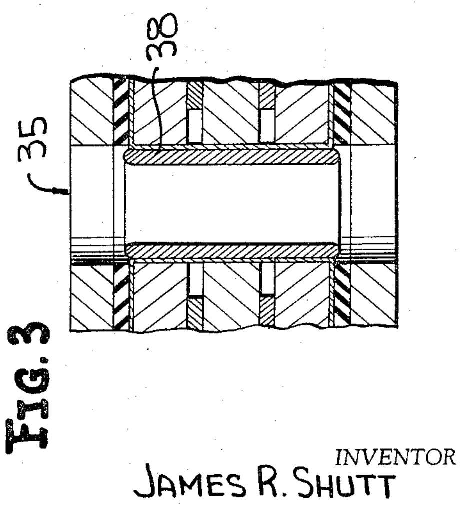
Figures 6, 7, 8:
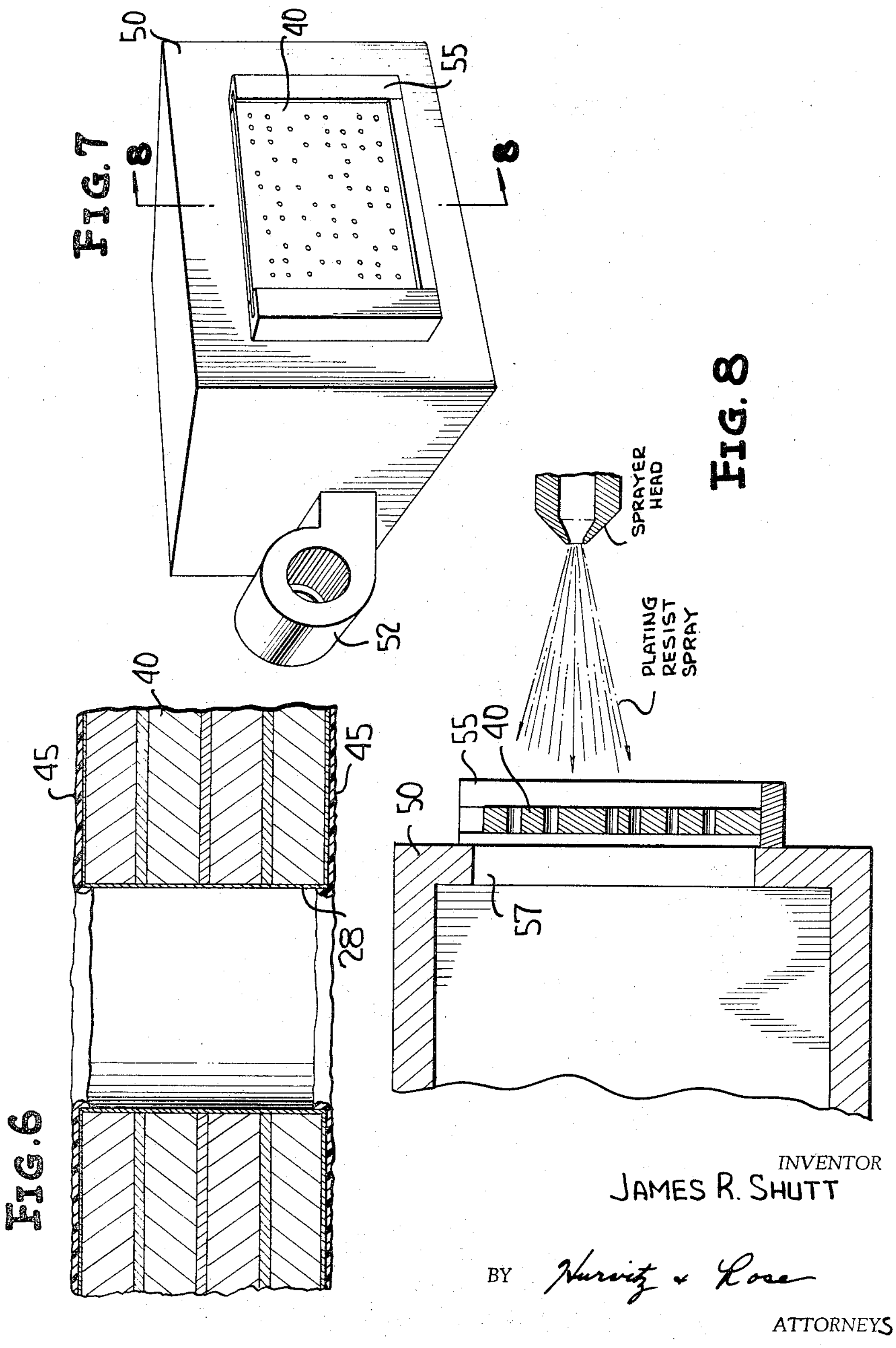

The above, and still further objects, features and attendant advantages of the present invention will become apparent from a consideration of the following detailed description of certain specific embodiments thereof, especially when taken in conjunction with the accompanying drawings in which:

FIGURE 1 is a fragmentary perspective view of a multilayer printed circuit board fabricated in accordance with prior art methods;

FIGURES 2 through 5, inclusive, are fragmentary cross-sectional views illustrating sequence of fabrication in the method according to the present invention;

FIGURES 6 to 8 illustrate alternative arrangements for providing landless exterior surfaces on the composite board.

Referring now to FIGURE 1, a typical multilayer printed circuit board fabricated in accordance with the prior art methods comprises a plurality of adjacent dielectric media such as insulating sheets 10, 12, 14, the surfaces of which are partially covered by conductive patterns 19 in conformance with the final circuit configuration. Each insulating sheet is composed of a suitable dielectric material, such as fiberglass or epoxy glass laminate. The conductive patterns may consist of copper foil or other conductive material which has been applied to the surface or surfaces of the insulating sheets in any known manner, such as by adhesive bonding of previously stamped configurations or of foil sheets which are subsequently etched. A plurality of pads 20 are provided in the conductive pattern through which holes are subsequently drilled, punched, or otherwise suitably provided, either before or after the bonding of the sheets to the composite board. Typically, various of the pads are aligned in registry in the desired configuration, and a suitable bonding material 11, 13, such as epoxy resin or other insulating adhesive interposed between adjacent sheets, after which the sheets are bonded together by subjection to heat and pressure. The through-holes may then be provided through the pads in the several strata in a single operation, although in some known methods the holes are provided in individual sheets prior to the bonding process. An extremely thin layer of conductive material such as copper is then deposited on the exterior surfaces of the board, e.g.

16, and the interior of the holes 23, after which the board and holes are plated with a relatively thicker layer of conductive material, such as by a copper electroplating process. It is then necessary to remove the undesired copper areas from the surfaces of the board, as by abrasion techniques, prior to the deposition of a protective coating of solder, gold, or other conductive material to prevent corrosion of the exterior conductive areas upon exposure to the atmosphere. In the composite board of FIGURE 1, lands or pads 22 are left surrounding through-holes 23. As previously noted, the removal of the undesired copper from the board surfaces is accomplished at the expense of abrasion of the exterior surfaces of the dielectric sheets, thus subjecting the board to higher moisture absorption and increased dielectric failure. An additional disadvantage of such prior art methods is the waste of copper removed from the exterior surfaces.

Although the prior art methods vary to some extent in certain of the steps and techniques, the multilayer printed circuit board provided by such methods may be characterized as built up of several layers of insulated discrete circuits which are bonded under heat and pressure to form a homogeneous material interleafed with circuitry so aligned as to permit later interconnection by the formation of electrical through-hole connections. The exterior surfaces of the board remain metal clad after bonding, necessitating selective removal thereof. In accordance with the present invention, however, methods are provided by which the through-holes are plated without plating exterior board surfaces, and thus the latter are interrupted only by conductive feedthroughs substantially flush therewith.

Referring now to FIGURES 2 through 5, inclusive, in the preferred method a microscopically thin film of conductive material 28 is deposited, by a process known as "seeding," on the exposed surfaces 16, 17 of the board, including the walls of the holes, following the bonding and hole-forming steps. This conductive film is required to provide a conductive path for the electrodes in the electroplating process. The film may be rapidly and easily removed by known chemical reduction techniques. Next the composite board is preferably sandwiched between solid masks 25 of insulating material, such as glass epoxy, which have been match drilled from the same master drill template used for each board or sheet processed in the same configuration. The holes in the rigid mask are thus in registry with the holes in the board that are to be through-plated. The surfaces of the mask which are superposed on the exterior surfaces of the board are preferably of a deformable material 27 such as silastic compound (silicone rubber) which, after the masks are clamped in place, will prevent capillary flow of plating material therebeneath. Alternatively, the mask surfaces may be coated with an adhesive material of any well known type to inhibit bleed-in of the plating solution. In addition to the previously noted advantages of this method, a rigid mask of the type described is inexpensive to produce, may be reused a great number of times, and is superior to chemical masks insofar as the quality of the final plated through-hole produced is concerned. Masks 25 may be pinned, as at 30, to the composite board, prior to clamping of the entire assembly, to ensure proper registration of the holes. A relatively thick layer of conductive medium 38 such as copper may then be deposited, as by electroplating, upon the exposed portions of the conductive film, thereby interconnecting the printed circuit layers or strata of the board is desired fashion via padless plated through-holes. As a final step, a protective coating 39, for example tin-lead, gold, rhodium, or the like, is applied to the plated through-holes and the mask templates removed. The microscopic seeded film of conductive material 28 which has been used to provide the conductive path for the electroplating process may be easily and rapidly removed from the unplated exterior surfaces 16 and 17 by an acid etch, such as ferric chloride ammonium persulfate, chromic acid or others depending upon the plated protective coating utilized without harm to the plated, protected hole walls. On the other hand, once the exterior surfaces have been plated, as in the prior art methods, removal of the plating presents a signficant problem, and, insofar as I am aware, cannot be accomplished without a deleterious effect on the composite board. The described method produces a high quality plated through-hole in an inexpensive manner using a reusable mask. Moreover, this method provides uncluttered and non-conductive surface areas, permitting electronic component placement on the board to obtain packing densities comparable to those using welded cord wood assembly techniques.

An alternative method of masking the multilayer board using plating resist emulsion is illustrated in FIGURE 6. Again a thin film of conductive material 28 is applied to the entire board surface, including the walls of the holes. The plating resist emulsion is then placed on the board surface by a standard screening technique, as by using a fine-grid blank screen. During the subsequent plating process the conductive material will be deposited in a layer on exposed hole surfaces only, i.e. those areas uncoated by resistive emulsion. Finally, a protective coating of the type previously described is deposited over the plated surfaces. The resistive emulsion may be dissolved by known chemical solvent techniques, such as by use of a vapor degreaser, the condensate of which attacks the emulsion only. The thin conductive film remaining on the board surface may then be removed in the previously described manner.

To eliminate any possibility of runover of the plating resist emulsion into the rim of the through-hole and consequent interference with the plating as shown in FIGURE 6 (45 onto 28), the resist may be applied to the board surfaces using apparatus illustrated in FIGURES 7 and 8. A pressure chamber 50 has a printed circuit board holding fixture, or rack, 55 which is provided adjacent an opening 57 in the chamber. A forced air blower 52 mounted on the chamber produces a slightly positive air pressure in the chamber with respect to that existing outside the chamber, such that when the board is placed in the rack, air is forced through the feed holes. The plating resist emulsion is then sprayed upon the exposed surface 40 of the board, the air leaving the holes preventing any resist from entering and masking the walls of the through-holes. There is thus removed any possibility of interference of resist material with the plating to insure a continuous conductive layer over the walls of each hole. Moreover, the elimination of plating resist run-over into the hole will insure that a full protective coating covers the copper plate and prevents air oxidation thereof.

While certain preferred methods and embodiments have been shown and described, it will be apparent that various changes and modifications may be resorted to without departing from the true spirit and scope of the present invention as defined by the appended claims.

I claim:

1. In the process of manufacturing multilayer printed circuit boards, each board comprising a plurality of insulative sheets having conductive circuit patterns thereon, bonded together to form a plurality of insulated circuit strata between exterior insulative surfaces, and a plurality of holes therethrough, the steps of seeding said exterior surfaces and the walls of said holes with a thin film of conductive material;

completely masking said exterior surfaces with rigid insulative templates having resilient surfaces and having holes corresponding to those in the board, by placing said resilient surfaces against said seeded exterior surfaces of said board with the template holes disposed in registry with the holes in said board;

maintaining said templates in place under pressure to force said resilient surfaces thereof against said seeded exterior surfaces of said board, thereby preventing exposure of said seeded exterior surfaces to plating material, while electroplating the conductive film on the walls of said holes via a conductive path including the conductive film on said seeded exterior surfaces, to electrically connect said circuit strata through a relatively thick conductive layer; and removing said templates and the thin conductive film from said seeded exterior surfaces to expose said insulative exterior surfaces with padless plated through-holes therebetween.

2. The process according to claim 1 wherein said resilient surfaces comprise adhesive material.

References Cited

UNITED STATES PATENTS

| | | |
|---|---|---|
| 2,872,391 | 2/1959 | Hauser et al. |
| 2,897,409 | 7/1959 | Gitto. |
| 3,154,478 | 10/1964 | Lee. |
| 3,171,756 | 3/1965 | Marshall. |
| 3,261,769 | 7/1966 | Coe et al. |

CHARLIE T. MOON, *Primary Examiner.*

J. L. CLINE, *Assistant Examiner.*